(12) United States Patent
Kim

(10) Patent No.: US 11,637,146 B2
(45) Date of Patent: Apr. 25, 2023

(54) ELECTRONIC DEVICE AND METHOD FOR FABRICATING THE SAME

(71) Applicant: SK hynix Inc., Icheon (KR)

(72) Inventor: Hwang-Yeon Kim, Icheon (KR)

(73) Assignee: SK hynix Inc., Icheon (KR)

( * ) Notice: Subject to any disclaimer, the term of this patent is extended or adjusted under 35 U.S.C. 154(b) by 0 days.

(21) Appl. No.: 17/590,545

(22) Filed: Feb. 1, 2022

(65) Prior Publication Data

US 2022/0157890 A1 May 19, 2022

Related U.S. Application Data

(63) Continuation of application No. 16/868,471, filed on May 6, 2020, now Pat. No. 11,271,041.

(30) Foreign Application Priority Data

Dec. 12, 2019 (KR) .......................... 10-2019-0165497

(51) Int. Cl.
*H01L 27/24* (2006.01)
*H01L 45/00* (2006.01)

(52) U.S. Cl.
CPC ...... *H01L 27/2463* (2013.01); *H01L 27/2409* (2013.01); *H01L 45/1675* (2013.01)

(58) Field of Classification Search
CPC .................................................. H01L 25/0657
See application file for complete search history.

(56) References Cited

FOREIGN PATENT DOCUMENTS

KR 101535653 B1 7/2015
KR 1020160056376 A 5/2016

*Primary Examiner* — Mounir S Amer

(57) ABSTRACT

A semiconductor memory includes a substrate including a first region in which a plurality of variable resistance elements are arranged, second and third regions on different sides of the first region, a plurality of first lines disposed over the substrate and extending across the first region and the second region, a plurality of second lines disposed over the first lines and extending across the first region and the third region. The variable resistance elements are positioned at intersections of the first lines and the second lines between the first lines and the second lines, a contact plug is disposed in the third region with an upper end coupled to the second line, and a resistive material layer is interposed between the second line and the variable resistance element in the first region but not between the second line and the contact plug in the third region.

20 Claims, 25 Drawing Sheets

ELECTRONIC DEVICE AND METHOD FOR FABRICATING THE SAME

CROSS-REFERENCE TO RELATED APPLICATIONS

The present application is a continuation of U.S. patent application Ser. No. 16/868,471 filed May 6, 2020, which claims priority of Korean Patent Application No. 10-2019-0165497, filed on Dec. 12, 2019, which is incorporated herein by reference in its entirety.

TECHNICAL FIELD

This patent document relates to memory circuits or devices and their applications in electronic devices or systems.

BACKGROUND

Recently, as electronic appliances trend toward miniaturization, low power consumption, high performance, multi-functionality, and so on, semiconductor devices capable of storing information in various electronic appliances such as a computer, a portable communication device, and so on have been demanded in the art, and research has been conducted for the semiconductor devices. Such semiconductor devices include semiconductor devices which can store data using a characteristic that they are switched between different resistant states according to an applied voltage or current, for example, an RRAM (resistive random access memory), a PRAM (phase change random access memory), an FRAM (ferroelectric random access memory), an MRAM (magnetic random access memory), an E-fuse, etc.

SUMMARY

The disclosed technology in this patent document includes various implementations of an electronic device capable of reducing process difficulty and process cost while improving reliability and performance characteristics, and a method for fabricating the same.

In an implementation, an electronic device includes a semiconductor memory, which includes: a substrate including a first region in which a plurality of variable resistance elements are arranged, a second region disposed on one side of the first region in a first direction, and a third region disposed on another side of the first region in a second direction crossing the first direction; a plurality of first lines disposed over the substrate and extending in the first direction across the first region and the second region; a plurality of second lines disposed over the first lines and extending in the second direction across the first region and the third region; the variable resistance elements positioned at intersections of the first lines and the second lines between the first lines and the second lines; a contact plug disposed in the third region and having an upper end coupled to the second line; and a material layer interposed between the second line and the variable resistance element in the first region while being omitted between the second line and the contact plug in the third region, the material layer increasing a resistance of the variable resistance element.

In another implementation, an electronic device includes a semiconductor memory, which includes: a substrate including a first region in which a plurality of variable resistance elements are arranged, a second region disposed on one side of the first region in a first direction, and a third region disposed on one side of the first region in a second direction crossing the first direction; a plurality of first lines disposed over the substrate and extending in the first direction across the first region and the second region; a plurality of second lines disposed over the first lines and extending in the second direction across the first region and the third region; the variable resistance elements positioned at intersections of the first lines and the second lines between the first lines and the second lines; a contact plug disposed in the third region and having an upper end coupled to the second line; and a material layer interposed between the second line and the variable resistance element in the first region and extending to the third region, the material layer increasing a resistance of the variable resistance element, wherein a thickness of the material layer in the first region is constant, and a thickness of the material layer in the third region is variable.

In another implementation, a method for fabricating an electronic device comprising a semiconductor memory, includes: providing a substrate including a first region, a second region disposed on one side of the first region in a first direction, and a third region disposed on another side of the first region in a second direction crossing the first direction; forming a plurality of first lines extending in the first direction across the first region and the second region, over the substrate; forming the variable resistance elements over the first lines in the first region; forming an interlayer insulating layer that fills spaces between the variable resistance elements; forming a contact plug passing through the interlayer insulating layer in the third region; forming a material layer that covers the variable resistance elements, the interlayer insulating layer and the contact plug, the material layer increasing a resistance of the variable resistance element; removing a portion of the material layer, which is disposed over the contact plug, to form a material layer pattern; and forming a plurality of second lines over the material layer pattern and the contact plug, the plurality of second lines extending in the second direction across the first region and the third region.

These and other aspects, implementations and associated advantages are described in greater detail in the drawings, the description and the claims.

DETAILED DESCRIPTION

Figure 1:
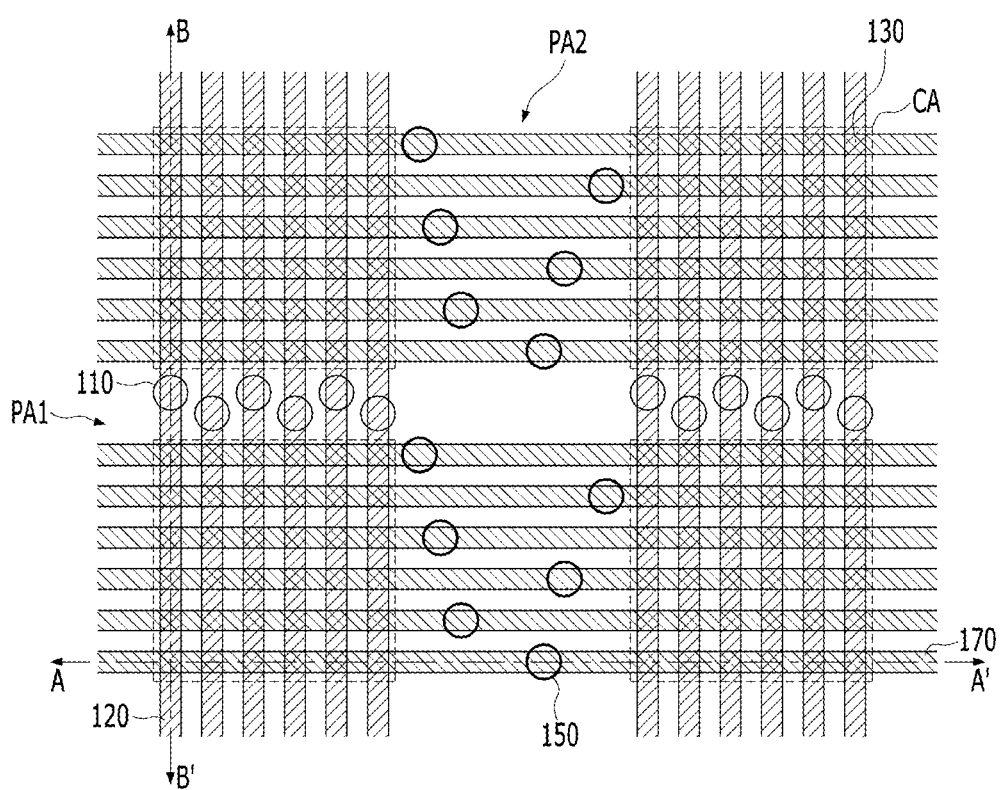
FIGS. 1, 2A-2B, 3A-3B, 4A-4B, 5A-5B, 6A-6B and 7A to 7B are views illustrating a semiconductor memory according to an implementation of the present disclosure, and a method for fabricating the same.

Various examples and implementations of the disclosed technology are described below in detail with reference to the accompanying drawings.

The drawings may not be necessarily to scale and in some instances, proportions of at least some of structures in the drawings may have been exaggerated in order to clearly illustrate certain features of the described examples or implementations. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure may not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

Figure 5A:
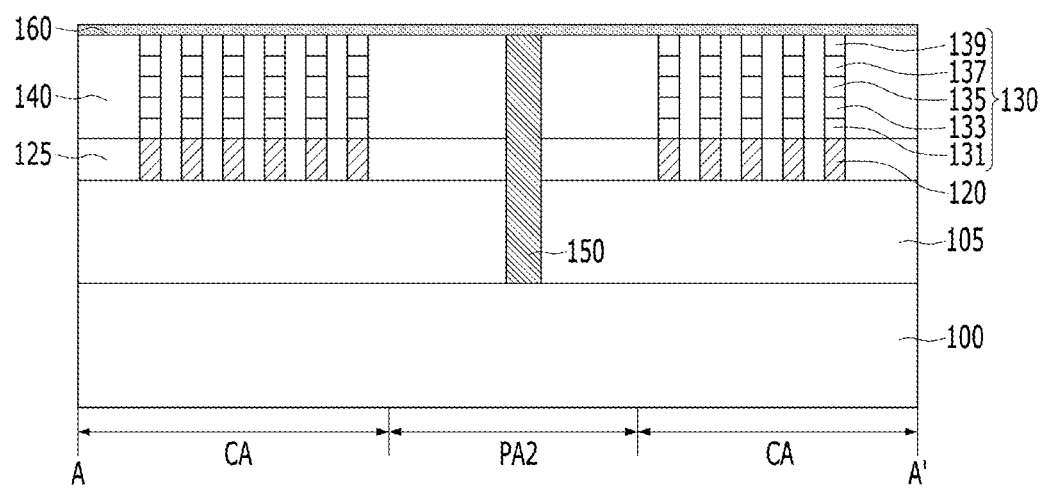
Figure 5B:
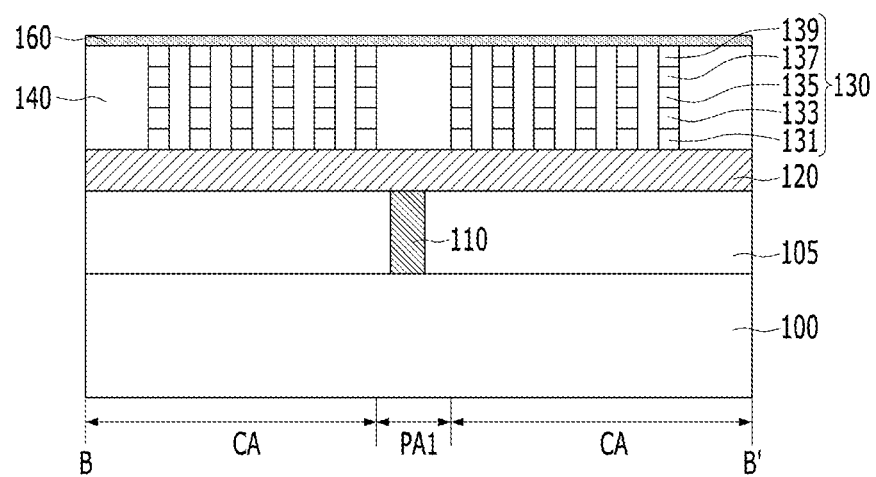
Figure 6A:
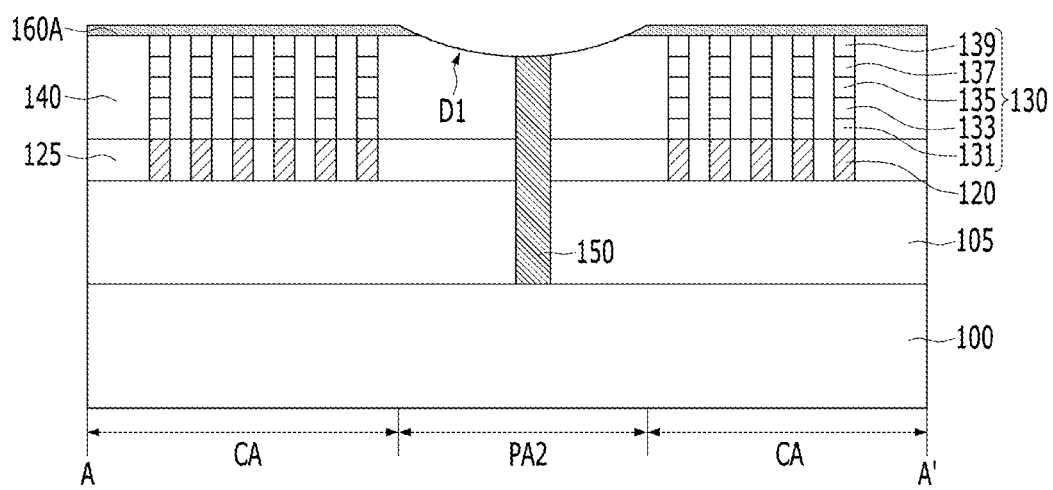
Figure 6B:
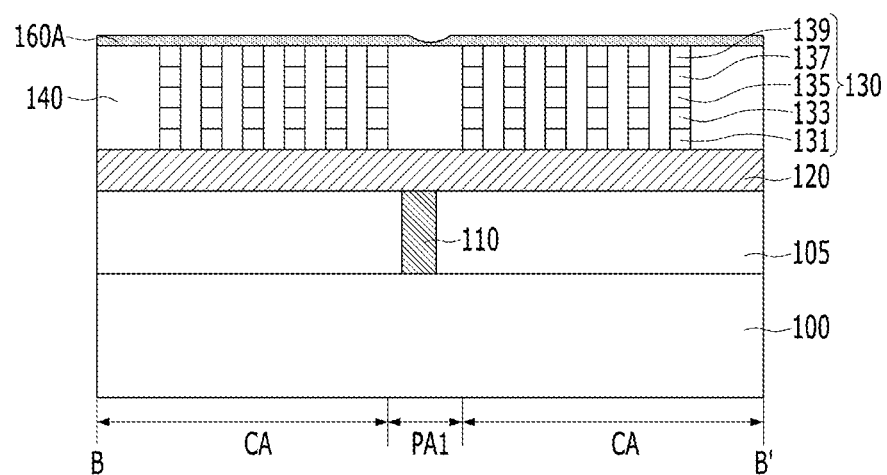
Figure 7A:
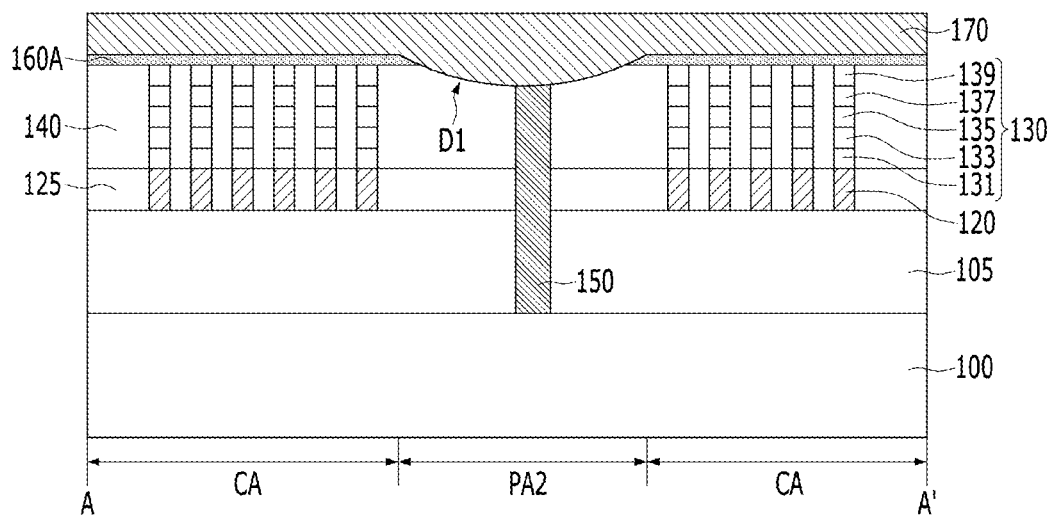
Figure 7B:
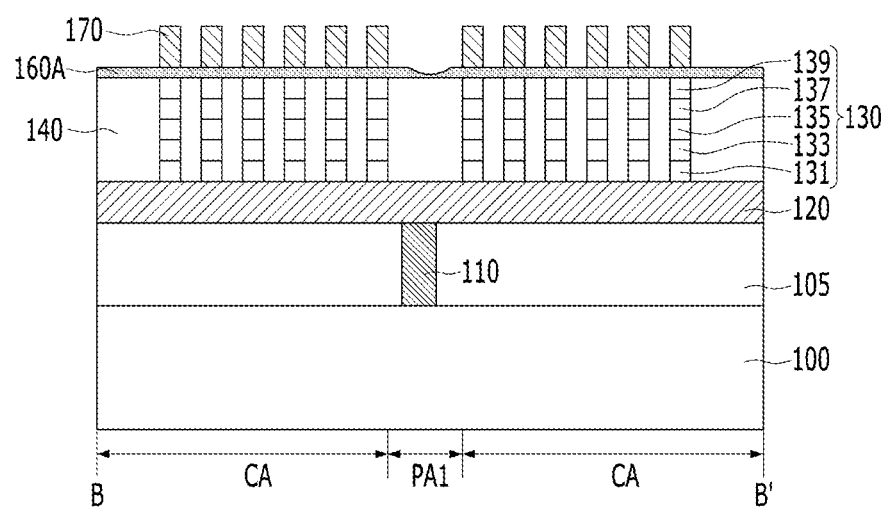

FIGS. 1 to 7B are views illustrating a semiconductor memory according to an implementation of the present disclosure, and a method for fabricating the same. FIG. 1 is a plan view illustrating the semiconductor memory, FIG. 7A is a cross-sectional view taken along a line A-A' of FIG. 1, and FIG. 7B is a cross-sectional view taken along a line B-B' of FIG. 1. FIGS. 2A to 6B are cross-sectional views illustrating intermediate process steps for fabricating the semiconductor memory of FIGS. 1, 7A, and 7B. FIGS. 2A, 3A, 4A, 5A and 6A are views from the perspective of a cross section taken along the line A-A' of FIG. 1. FIGS. 2B, 3B, 4B, 5B and 6B are views from the perspective of a cross section taken along the line B-B' of FIG. 1.

First, a fabricating method will be described.

Figure 2A:
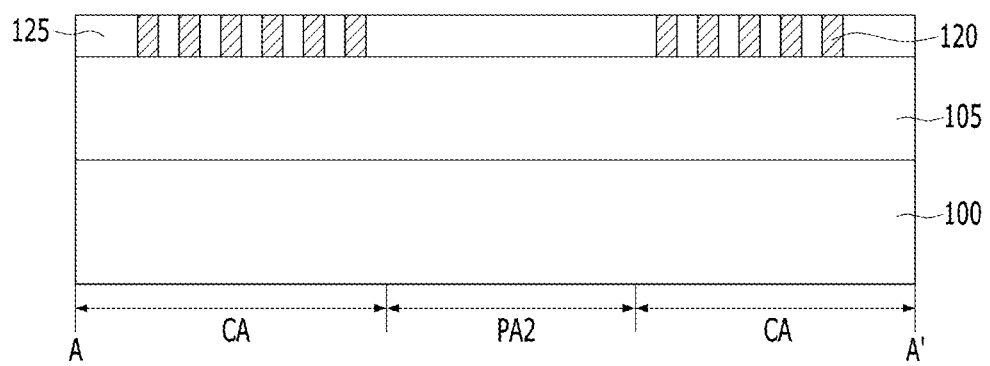
Figure 2B:
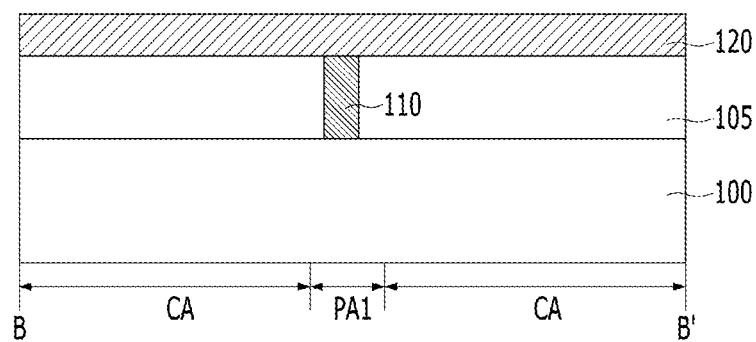

Referring to FIGS. 1, 2A and 2B, a substrate 100 including a semiconductor material such as silicon may be provided. In the substrate 100, a predetermined lower structure (not shown) may be formed. For example, a transistor constituting an integrated circuit, or the like, may be formed in the substrate 100.

A cell region CA and peripheral circuit regions PA1 and PA2 may be defined in the substrate 100. The cell region CA may be a region in which memory cells are arranged, and the peripheral circuit regions PA1 and PA2 may be regions in which various components constituting peripheral circuits, excluding the memory cells, are arranged. In the present implementation, four cell regions CA are spaced apart from each other while arranged in a 2*2 array along a first direction parallel to line B-B' and a second direction parallel to line A-A', and the peripheral circuit regions PA1 and PA2 are located between cell regions CA. For convenience of description, a region between two cell regions CA arranged in the first direction may be referred to as a first peripheral circuit region PA1, and a region between two cell regions CA arranged in the second direction may be referred to as a second peripheral circuit region PA2. In the present implementation, an area of the second peripheral circuit region PA2 may be greater than an area of the first peripheral circuit region PA1. However, embodiments of the present disclosure are not limited to this configuration, and the arrangements or the sizes of the cell regions CA and the peripheral circuit regions PA1 and PA2 may differ.

Subsequently, a first interlayer insulating layer 105 may be formed over the substrate 100. The first interlayer insulating layer 105 may include various insulating materials such as silicon oxide, silicon nitride, or a combination thereof.

Subsequently, a first contact plug 110 may be formed in the first interlayer insulating layer 105 to penetrate the first interlayer insulating layer 105 and be connected to a portion of the substrate 100. The first contact plug 110 may be formed to connect to a first line 120 in the first peripheral region PA1. A plurality of first contact plugs 110 may be connected to a plurality of first lines 120 in a one-to-one correspondence. The first contact plugs 110 may be arranged in a zigzag or alternating pattern along the second direction. This is to provide gaps between adjacent first contact plugs 110 in the second direction. However, arrangement of the first contact plugs 110 may be differ in other embodiments. The first contact plug 110 may be formed of a conductive material, for example a metal such as platinum (Pt), tungsten (W), aluminum (Al), copper (Cu) and tantalum (Ta), a metal nitride such as titanium nitride (TiN) and tantalum nitride (TaN), or a combination thereof.

Subsequently, the first lines 120 may be formed by depositing a conductive layer on a plurality of first interlayer insulating layer 105 in which the first contact plug 110 is formed, and selectively etching the conductive layer. Each first line 120 may have a line shape extending in the first direction. In the present implementation, a first line 120 may cross two cell regions CA arranged in the first direction and the first peripheral circuit region PA1 therebetween. Accordingly, the first line 120 may be in contact with an upper end of the first contact plug 110. The first line 120 may be formed of may be formed of various conductive materials, for example a metal such as platinum (Pt), tungsten (W), aluminum (Al), copper (Cu) and tantalum (Ta), a metal nitride such as titanium nitride (TiN) and tantalum nitride (TaN), or a combination thereof.

Subsequently, a second interlayer insulating layer 125 may be formed to fill spaces between the first lines 120.

Figure 3A:
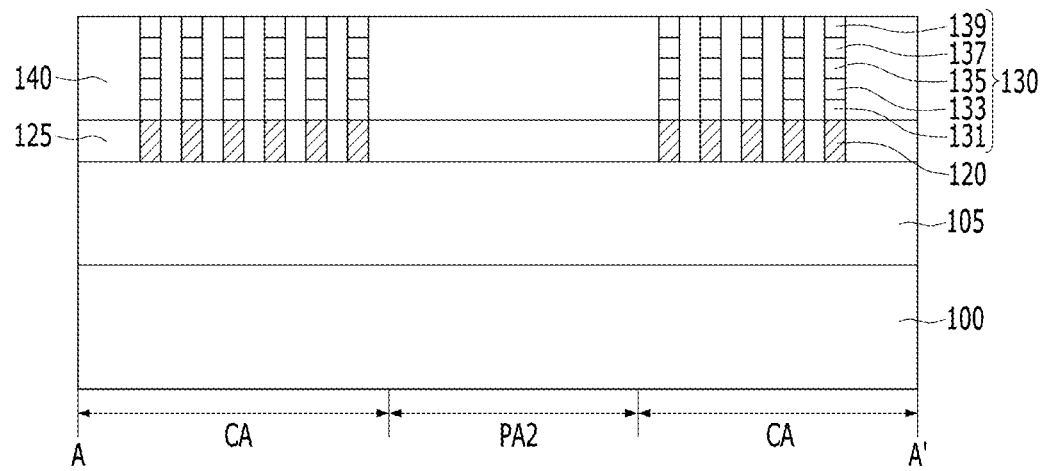
Figure 3B:
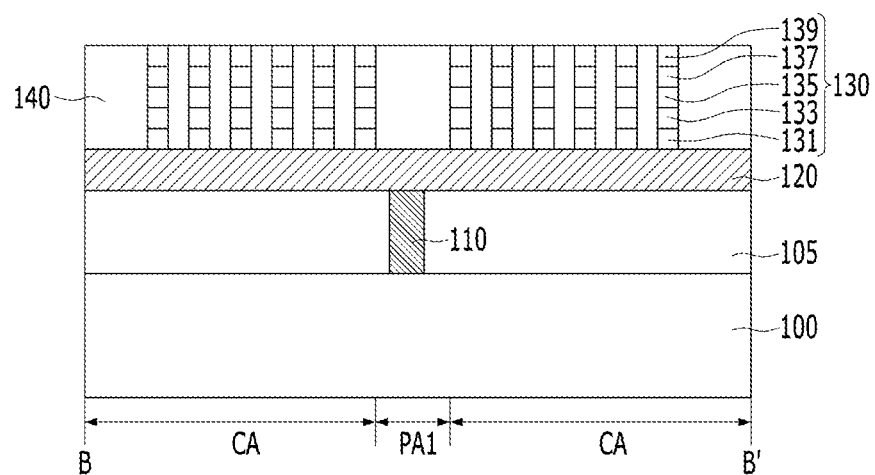

Referring to FIGS. 1, 3A and 3B, variable resistance elements 130 may be formed by forming a material layer of a variable resistance element on the first lines 120 and the second interlayer insulating layer 125, and selectively etching the material layer.

Each of the variable resistance elements 130 may have an island shape in a plan view, and adjacent variable resistance elements 130 may be separated from each other. The variable resistance elements 130 may be positioned at intersections between the first lines 120 and second lines 170. For reference, in the present implementation, the second line 170 may extend in the second direction to cross two cell regions CA arranged in the second direction and the second peripheral circuit region PA2 therebetween. Accordingly, the first lines 120 and the second lines 170 may cross only in the cell regions CA. As a result, the variable resistance elements 130 may be arranged in a matrix form along the first and second directions in the cell regions CA.

The variable resistance element 130 may have a variable resistance characteristic which switches between different resistance states to store data. That is, the variable resistance element 130 may function as a memory cell.

Also, the variable resistance element 130 may have a multi-layered structure. As an example, the variable resistance element 130 may include a stacked structure of a lower electrode layer 131, a selection element layer 133, an intermediate electrode layer 135, a variable resistance layer 137 and an upper electrode layer 139.

The lower electrode layer 131 and the upper electrode layer 139 may be positioned at ends of the variable resistance element 130, for example, at a lower end and an upper end thereof, respectively, and may apply a voltage to operate the variable resistance element 130. The intermediate electrode layer 135 may physically separate the selection element layer 133 and the variable resistance layer 137, but electrically connect them. The lower electrode layer 131, the intermediate electrode layer 135 or the upper electrode layer 139 may be formed of various conductive materials, for example a metal such as platinum (Pt), tungsten (W), aluminum (Al), copper (Cu) and tantalum (Ta), a metal nitride such as titanium nitride (TiN) and tantalum nitride (TaN), or a combination thereof. Alternatively, the lower electrode layer 131, the intermediate electrode layer 135 or the upper electrode layer 139 may be a carbon electrode. In some embodiments, at least one of the lower electrode layer 131, the intermediate electrode layer 135 and the upper electrode layer 139 may be omitted.

The selection element layer 133 may prevents current leakage between the variable resistance elements 130. The current leakage may occur because the variable resistance elements 130 share the first line 120 or the second line 170. To this end, the selection element layer 133 may have a threshold switching characteristic for blocking or substantially limiting a current when a magnitude of an applied voltage is less than a predetermined threshold value and for allowing a current to abruptly increase above the threshold value. The threshold value may be referred to as a threshold voltage, and selection element layer 133 may be implemented in a turn-on state or a turn-off state based on the threshold voltage. The selection element layer 133 may include a diode, an OTS (Ovonic Threshold Switching) material such as a chalcogenide material, an MIEC (Mixed Ionic Electronic Conducting) material such as a metal containing chalcogenide material, an MIT (Metal Insulator Transition) material such as $NbO_2$, $VO_2$, or the like, or a tunneling insulating material having a relatively wide band gap such as $SiO_2$, $Al_2O_3$, or the like.

The variable resistance layer 137 may be a portion that functions to store data in the variable resistance element 130. To this end, the variable resistance layer 137 may have a variable resistance characteristic that switches between different resistance states depending on an applied voltage or current. The variable resistance layer 137 may have a single-layered structure or a multi-layered structure including at least one of materials used for an RRAM, a PRAM, an MRAM, an FRAM, or the like, that is, a metal oxide such as a perovskite-based oxide, a transition metal oxide, or the like, a phase change material such as a chalcogenide-based material, a ferromagnetic material, a ferroelectric material, or the like. As an example, the resistance of the variable resistance layer 137 may change due to generation or disappearance of a conductive path therein. That is, when the conductive path through the variable resistance layer 137 is generated in the variable resistance layer 137, the variable resistance layer 137 may have a low resistance state. On the contrary, when the conductive path disappears, the variable resistance layer 137 may have a high resistance state. When the variable resistance layer 137 includes a metal oxide containing a large amount of oxygen vacancies, a conductive path due to the behavior of the oxygen vacancies may be generated or extinguished in the variable resistance layer 137. However, the conductive path may be formed in various ways depending on the type, the film structure, or the operating characteristics of the variable resistance layer 137.

Subsequently, a third interlayer insulating layer 140 may be formed to fill spaces between the variable resistance elements 130.

Figure 4A:
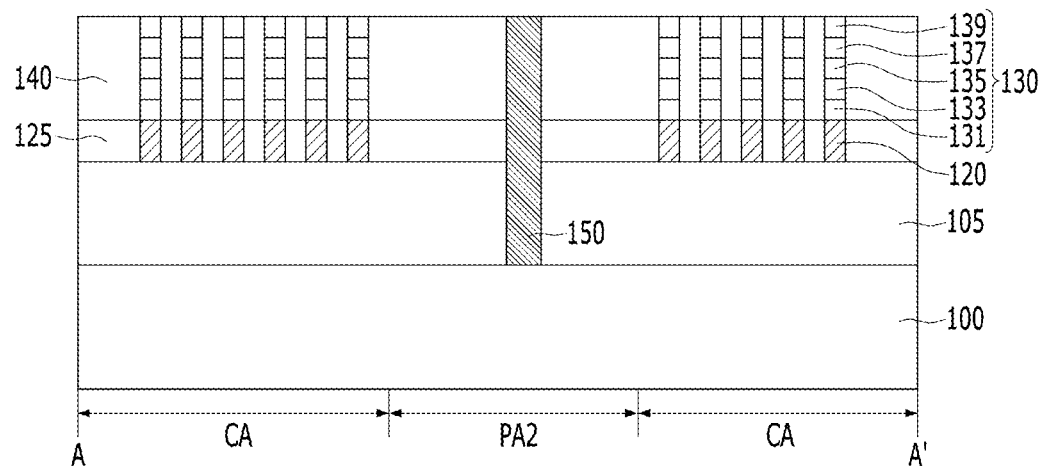
Figure 4B:
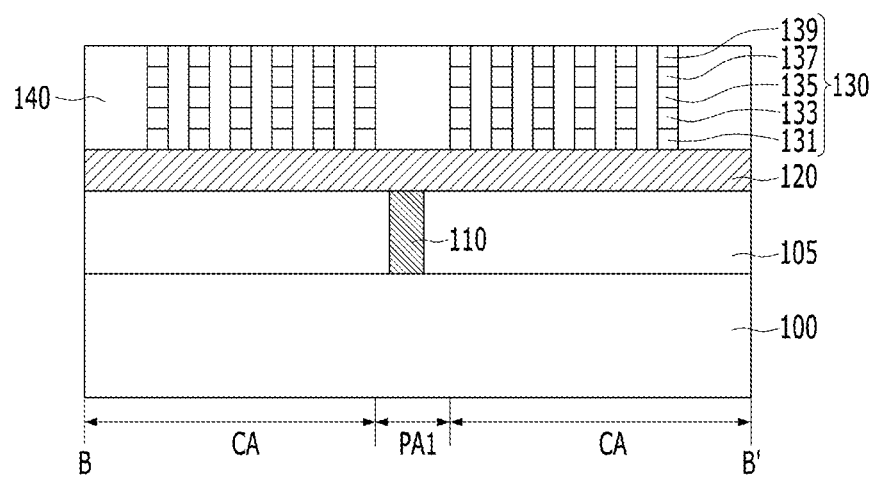

Referring to FIGS. 1, 4A and 4B, a second contact plug 150 may be formed in the first to third interlayer insulating layers 105, 125 and 140 to pass through the first to third interlayer insulating layers 105, 125, and 140 and be connected to a portion of the substrate 100. The second contact plug 150 may be formed to be connected to the second line 170 described later in the second peripheral circuit region PA2. A plurality of second contact plugs 150 may be connected to the second lines 170 in a one-to-one correspondence. The second contact plugs 150 may be arranged in a zigzag pattern along the first direction. This is to secure a gap between adjacent second contact plugs 150 in the first direction. However, the present disclosure is not limited thereto, and the arrangement of the second contact plugs 150 may differ in other embodiments. The second contact plug 150 may be formed of various conductive materials, for example a metal such as platinum (Pt), tungsten (W), aluminum (Al), copper (Cu) and tantalum (Ta), a metal nitride such as titanium nitride (TiN) and tantalum nitride (TaN), or a combination thereof.

Referring to FIGS. 1, 5A and 5B, a material layer 160 may be formed on the resultant structure shown in FIGS. 4A and 4B. The material layer may function as a resistance component that increases the resistance of the variable resistance element 130. The material layer 160 may be formed using a deposition method to cover the entire surface of the substrate 100. The reason for forming the material layer 160 is as follows.

The variable resistance element 130 may switch between a high resistance state and a low resistance state. The operation of changing the variable resistance element 130 from the high resistance state to the low resistance state may be referred to as a set operation, and the operation of changing the variable resistance element 130 from the low resistance state to the high resistance state may be referred to as a reset operation.

An initial set operation may be referred to as a forming operation. A voltage applied in the forming operation may be greater than a voltage applied in the set operation. This is because the voltage required to generate the first or initial conductive path in the variable resistance layer 137 is larger than the voltage required to generate conductive paths in subsequent operations. After the forming operation, the set voltage and the reset voltage applied in the set operation and the reset operation may be substantially constant. However, there is a problem that overshooting current or spike current occurs when the variable resistance element 130 changes to the low resistance state in the forming operation and/or the set operation. Such overshooting current may damage the variable resistance element 130. For example, the overshooting current may increase the size of the conductive path formed in the variable resistance layer 137, resulting in an increased off current of the variable resistance element 130. When the off current of the variable resistance element 130 increases, current leakage through the variable resistance element 130 may increase, and a data read margin may be reduced due to a decrease in a difference with an on current. In order to prevent these problems, the resistance of the variable resistance element 130 may be increased. In the present implementation, material layer 160 having a relatively high resistance on the variable resistance element 130 may be formed to increase the resistance of the variable resistance element 130.

The material layer 160 may include a material having a higher resistance than a conductive material. The material layer 160 may have a higher resistance than the first line 120, the second line 170, or the electrode layers 131, 135 and 139. For example, the material layer 160 may include various insulating materials such as an insulating metal oxide, insulating metal nitride, silicon oxide, silicon nitride, or a combination thereof. For example, the material layer 160 may include WSiN, WN, TiN, or the like.

Even if the material layer 160 includes an insulating material, the material layer 160 should not block a voltage applied to the variable resistance element 130. Therefore, the material layer 160 may be relatively thin to exhibit ohmic-like behavior. This is because if the thickness of the material layer 160 decreases, the resistance of the material layer 160 decreases, irrespective of the type of the material layer 160, thereby having a leaky property. For example, the material layer 160 may have a thickness of several to several tens of Å, e.g., a thickness of 5 to 50 Å or 10 to 30 Å. For reference, the ohmic-like behavior may refer to a behavior in which a current flow increases as an applied voltage increases.

However, since the material layer 160 is a resistance component, operating characteristics of the semiconductor memory may be degraded, such as interrupting current transfer in a certain region. For example, the material layer 160 on the second contact plug 150 may increase contact resistance between the second contact plug 150 and the second line 170. In order to solve this problem, the subsequent process shown in FIGS. 6A and 6B may be performed.

Referring to FIGS. 1, 6A and 6B, a planarization process, for example, a chemical mechanical polishing (CMP) process, may be performed on the material layer 160 to form a material layer pattern 160A. The material layer pattern 160A may cover the cell regions CA while being omitted or absent from the area over at least the second contact plug 150 in the second peripheral circuit region PA2. At least a portion of the material layer 160 of the second peripheral circuit region PA2 can be selectively removed even without a mask for the following reasons.

In the cell region CA, since the first lines 120 and the second lines 170 cross each other, and a plurality of memory cells, that is, the variable resistance elements 130 are disposed between the first lines 120 and the second lines 170 at the intersections of the first lines 120 and the second lines 170, a density of patterns formed in the cell region CA is high. On the other hand, in the second peripheral circuit region PA2 in which the second lines 170 and the second contact plugs 150 connecting to the second lines 170 are disposed, a density of patterns formed in the second peripheral circuit region PA2 is lower than the density of the cell region CA. Because the pattern density is lower in the second peripheral circuit region PA2, the material layer 160 of the second peripheral circuit region PA2 is removed much faster from the second peripheral circuit region PA2 than it is from the cell region CA in the planarization process. As a result, the material layer 160 may remain in the cell region CA while at least a portion of the material layer 160 of the second peripheral circuit region PA2 may be removed.

The removal rate of the material layer 160 in the second peripheral circuit region PA2 may progressively decrease as it approaches the cell region CA, that is, toward both edges of the second peripheral circuit region PA2 in the second direction. In other words, the removal rate of the material layer 160 in the second peripheral circuit region PA2 may increase with distance from the cell region CA, that is, toward a center of the second peripheral circuit region PA2 in the second direction. In addition, the planarization process may be performed until upper ends of all the second contact plugs 150 of the second peripheral circuit region PA2 are exposed. That is, over-polishing may be performed to remove not only a portion of the material layer 160 but also a portion of the third interlayer insulating layer 140 and/or the second contact plug 150 in the second peripheral circuit region PA2. Accordingly, as illustrated, a dishing phenomenon (see 'D1') may occur in the second peripheral circuit region PA2 in which an upper surface of a resultant structure is recessed from the edges of the region toward the center in the second direction. In the cell region CA, the thickness of the material layer pattern 160A may be substantially constant. On the other hand, the thickness of the material layer pattern 160A of the second peripheral circuit region PA2 may gradually decrease from the outer edges of the second peripheral circuit region PA2 toward the center of the second peripheral circuit region PA2 in the second direction.

As seen in the present implementation, when an area of the second peripheral circuit region PA2 is larger than an area of the first peripheral circuit region PA1, parts of the second peripheral circuit region PA2 are farther from the higher density cell regions CA than the first peripheral circuit region PA1. In this case, a degree of removal of the material layer 160 in the first peripheral circuit region PA1 may be lower than that of the second peripheral circuit region PA2. In other words, the amount of dishing in the peripheral regions is proportional to the distance from the cell regions CA.

In the present implementation, a portion of the material layer pattern 160A disposed over the first peripheral circuit region PA1 remains and has a thickness smaller than the thickness of the portions of the material layer pattern 160A disposed over the cell region CA. However, the present disclosure is not limited to this embodiment. In another implementation, the material layer 160 may be removed to such an extent that the third interlayer insulating layer 140 is exposed in the first peripheral circuit region PA1. In this case, the material layer patterns 160A covering the cell regions CA that are spaced apart from each other in the first direction may also be separated from each other. Alternatively, in another implementation, when the pattern density of the first peripheral circuit region PA1 is higher, for example, when it is similar to the pattern density of the cell region CA, the material layer pattern 160A of the first peripheral circuit region PA1 may have substantially the same thickness as the material layer pattern 160A of the cell region CA.

Referring to FIGS. 1, 7A, and 7B, the second line 170 may be formed by depositing a conductive layer on a resultant structure of FIGS. 6A and 6B and selectively etching the conductive layer. The second line 170 may have a line shape extending in the second direction. In the present implementation, the second line 170 may cross two cell regions CA arranged in the second direction and the second peripheral circuit region PA2 therebetween. The second line 170 may not be in direct contact with the variable resistance element 130 in the cell region CA, but may be connected through the material layer pattern 160A. On the other hand, the second line 170 may directly contact an upper end of the second contact plug 150 in the second peripheral circuit region PA2. The second line 170 may be formed of various conductive materials, for example a metal such as platinum (Pt), tungsten (W), aluminum (Al), copper (Cu) and tantalum (Ta), a metal nitride such as titanium nitride (TiN) and tantalum nitride (TaN), or a combination thereof.

The second line 170 may have a constant thickness in the cell region CA. On the other hand, a portion of the second line 170 in the second peripheral circuit region PA2 may have a larger thickness than portions of the second line in the cell region CA.

In the present implementation, when forming the second line 170, the material layer pattern 160A is not etched. Accordingly, the material layer pattern 160A may have an even thickness in portions covering the cell region CA, and a thickness that decreases as the pattern extends over the peripheral regions. In addition, the material layer patterns 160A may be separated from each other with the second peripheral circuit region PA2 disposed between them in the second direction. However, the present disclosure is not limited thereto, and when the conductive layer is etched to form the second line 170, the material layer pattern 160A may be etched at the same time, which will be described later with reference to FIG. 8.

As a result, the semiconductor memory as shown in FIGS. 1, 7A, and 7B may be manufactured.

Referring again to FIGS. 1, 7A, and 7B, the semiconductor memory of the present implementation may include the substrate 100 including the cell region CA in which the plurality of variable resistance elements 130 are arranged, the first and second peripheral circuit regions PA1 and PA2 adjacent to the cell region CA, the first lines 120 disposed over the substrate 100 and extending in the first direction across the cell region CA and the first peripheral circuit region PA1, the second lines 170 disposed over and spaced apart from the first lines 120 and extending in the second direction across the cell region CA and the second peripheral circuit region PA2, the variable resistance elements 130 positioned at the intersections of the first lines 120 and the second lines 170 in the cell region CA where the first lines 120 and the second lines 170 cross each other, the first contact plug 110 disposed in the first peripheral circuit region PA1 and connected to the first line 120 through a lower surface of the first line 120, the second contact plug 150 disposed in the second peripheral circuit region PA2 and connected to the second line 170 through a lower surface of the second line 170, and the material layer 160 which is interposed between the second line 170 and the variable resistance element 130 while being absent from an area between the second line 170 and the second contact plug 150. The material layer 160 may increase the resistance of the variable resistance element 130.

The components of this semiconductor memory have already been described in detail in the description of an embodiment of a manufacturing method.

The following effects may be obtained in a semiconductor memory that is manufactured according to the embodiments described above.

First, since the material layer pattern 160A with insulative properties is formed on the variable resistance element 130 and increases the resistance of the variable resistance element, damage to the variable resistance element 130 due to overshooting current may be prevented. As a result, reliability of the variable resistance element 130 and the semiconductor memory including the same may be improved.

Also, since the material layer pattern 160A is formed by depositing the material layer 160 over an entire surface of the substrate 100 and performing a planarization process using a difference in the pattern density to affect thickness, an additional mask process may not be performed. Therefore, the process may be relatively easy to perform and the cost of the process may be reduced.

Further, by using the above process to provide direct contact between the second line 170 and the second contact plug 150 in the second peripheral circuit region PA2, it may be possible to improve the operating characteristics of the semiconductor memory.

Figure 8:
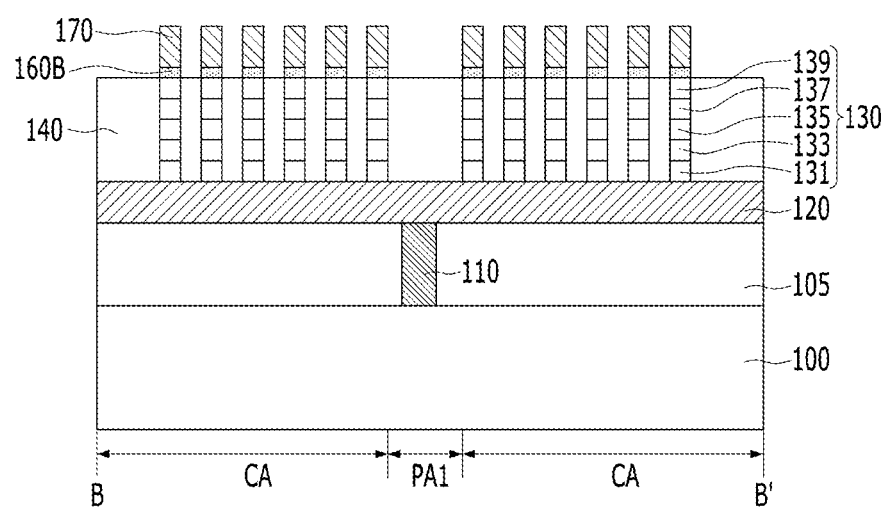
FIG. 8 is a view illustrating a semiconductor memory according to another implementation of the present disclosure.

FIG. 8 is a view illustrating a semiconductor memory according to another implementation of the present disclosure. FIG. 8 is a cross-sectional view taken along a line B-B' of FIG. 1. The differences from the embodiments discussed above will now be described.

Referring to FIG. 8, after etching the conductive layer for forming the second line 170, portions of the material layer pattern 160A exposed by the second line 170 may be etched as well. The remaining part of the material layer pattern which is additionally etched is indicated by a reference numeral 160B.

In the present implementation, the material layer pattern 160B may have the same pattern as the second line 170 in the cell region CA. That is, the material layer pattern 160B may have a line shape extending in the second direction while overlapping the second line 170 in the cell region CA.

On the other hand, cutting the material layer pattern 160B in the second peripheral circuit region PA2 may be substantially the same as the above-described implementation. That is, the cross-sectional shape of material layer pattern 160B along a line A-A' may be substantially the same as the material layer pattern 160A of FIG. 7A.

FIGS. 9A to 12B are views illustrating a semiconductor memory according to another implementation of the present disclosure, and a method for fabricating the same. FIGS. 9A, 10A, 11A and 12A are illustrated based on a cross-section along line A-A' of FIG. 1. FIGS. 9B, 10B, 11B and 12B are illustrated based on a cross-section along line B-B' of FIG. 1. The differences from the embodiments described with respect to FIGS. 2A-7B will be emphasized in the following description.

Figure 9A:
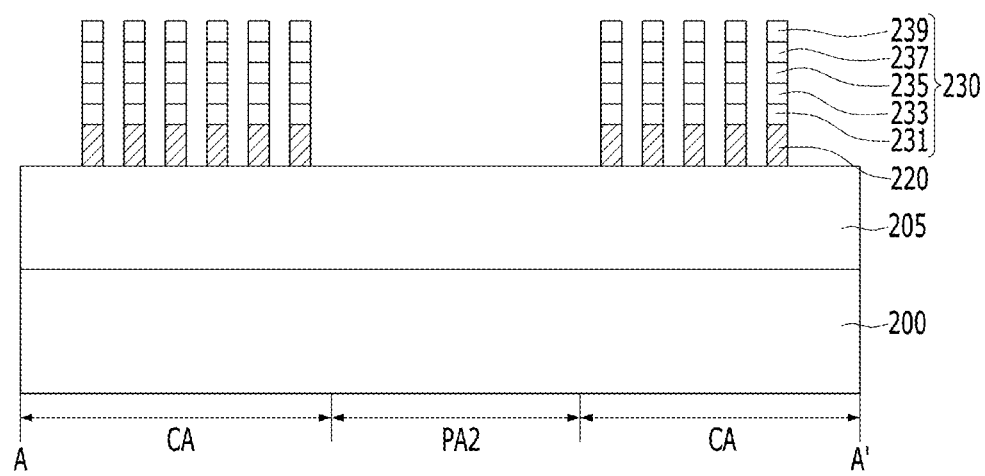
FIGS. 9A-9B, 10A-10B, 11A-11B and 12A to 12B are views illustrating a semiconductor memory according to another implementation of the present disclosure, and a method for fabricating the same.
Figure 9B:
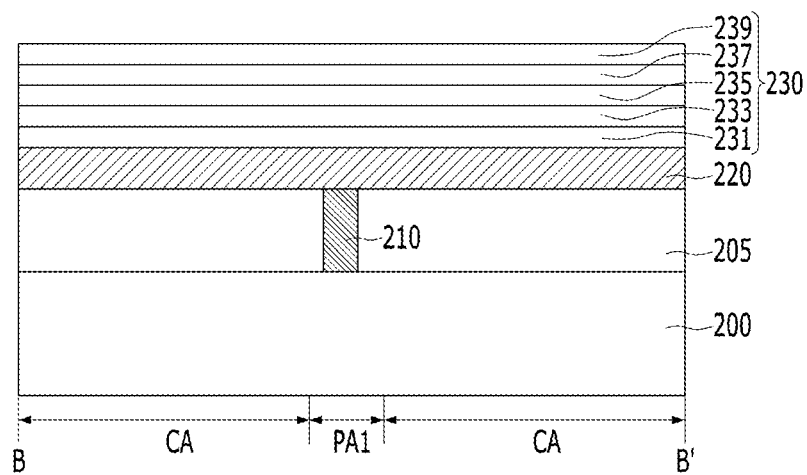

Referring to FIGS. 9A and 9B, after forming a first interlayer insulating layer 205 over a substrate 200 in which a cell region CA and peripheral circuit regions PA1 and PA2 are defined, a first contact plug 210 may be formed to extend through the first interlayer insulating layer 205 and be connected to a portion of the substrate 200. The first contact plugs 210 may be disposed to have one-to-one correspondence with the first lines 220 in the first peripheral circuit region PA1.

Subsequently, after depositing a conductive layer and a material layer for forming a variable resistance element over the first interlayer insulating layer 205 in which the first contact plug 210 is formed, the conductive layer and the material layer are collectively etched to form first lines 220 and initial variable resistance elements 230.

The first lines 220 may have a line shape extending in a first direction. Also, the first lines 220 may cross two cell regions CA arranged in the first direction and the first peripheral circuit region PA1 between the cell regions.

The initial variable resistance elements 230 may have the same pattern as the first lines 220 and overlap the first lines 220, respectively. Accordingly, the initial variable resistance elements 230 may also have a line shape extending in the first direction. The initial variable resistance element 230 may include an initial lower electrode layer 231, an initial selection element layer 233, an initial intermediate electrode layer 235, an initial variable resistance layer 237, and an initial upper electrode layer 239.

In this process, since the conductive layer and the material layer are etched together using one mask, both sidewalls of the initial variable resistance element 230 may be aligned with both sidewalls of the first line 220 in the second direction.

Figure 10A:
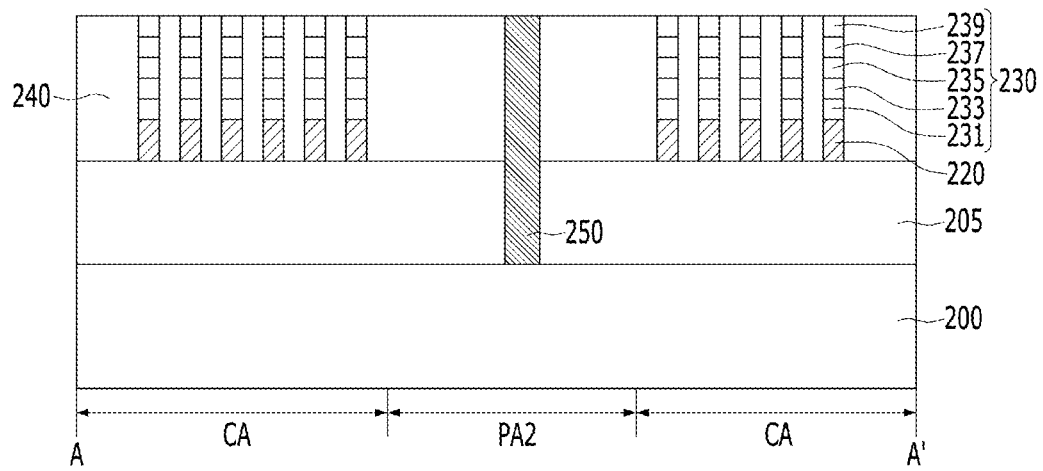
Figure 10B:
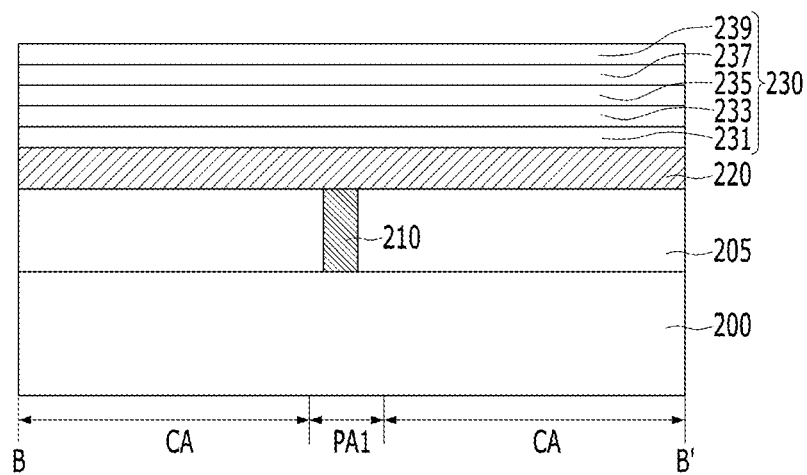

Referring to FIGS. 10A and 10B, a second interlayer insulating layer 240 may fill spaces between adjacent stacked structures in which the first line 220 and the initial variable resistance element 230 are stacked.

Subsequently, a second contact plug 250 may be formed in the first and second interlayer insulating layers 205 and 240 to penetrate the first and second interlayer insulating layers 205 and 240 and connect to a portion of the substrate 200. The second contact plugs 250 may be formed to have a one-to-one correspondence with second lines 270 (which will be described later) in the second peripheral circuit region PA2.

Figure 11A:
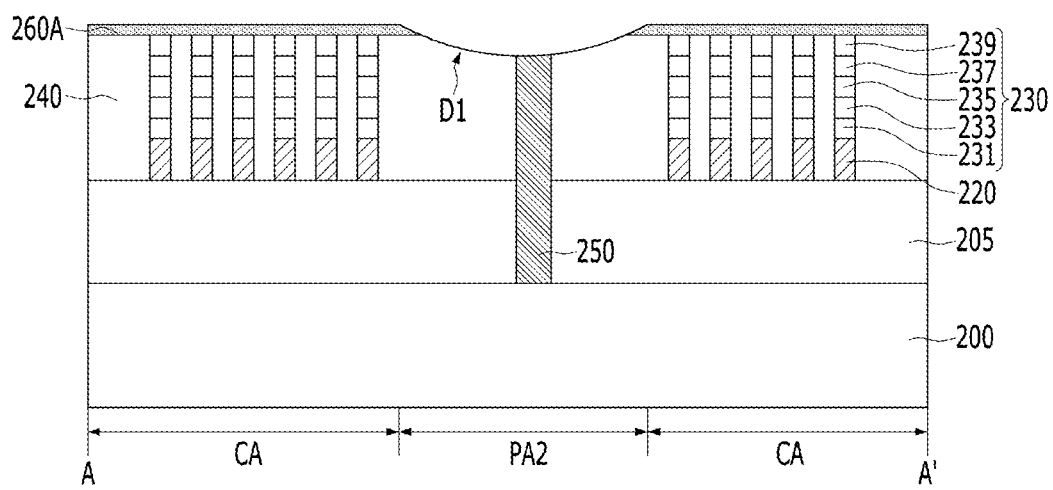
Figure 11B:
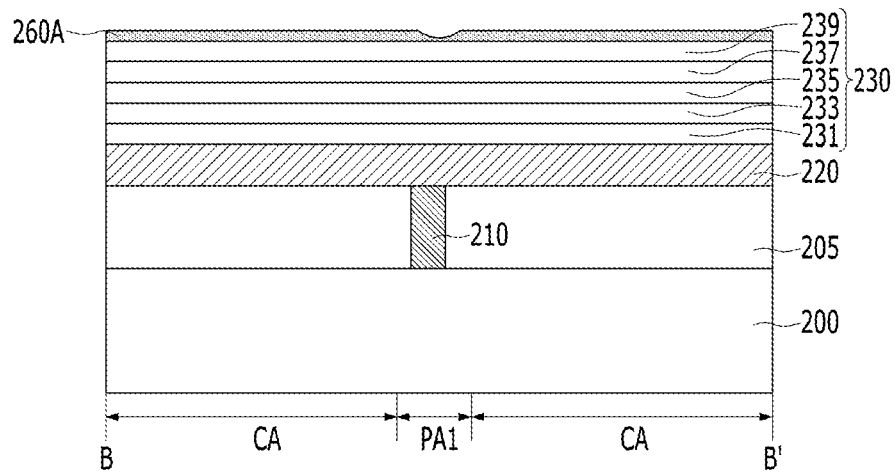

Referring to FIGS. 11A and 11B, after forming a resistive material layer on the resultant structure of FIGS. 10A and 10B, a planarization process may be performed to form a material layer pattern 260A which covers the cell region CA while exposing an upper end of the second contact plug 250.

Figure 12A:
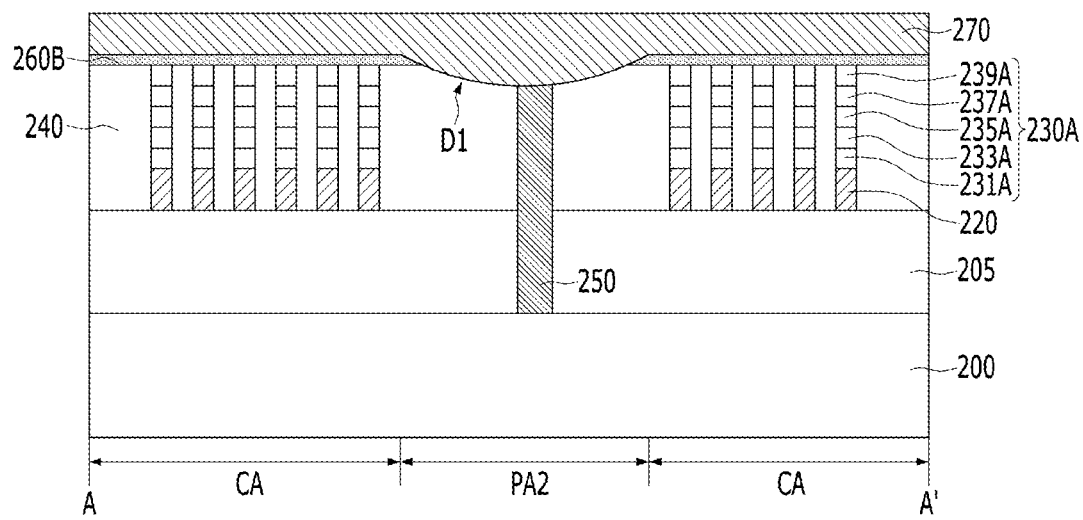
Figure 12B:
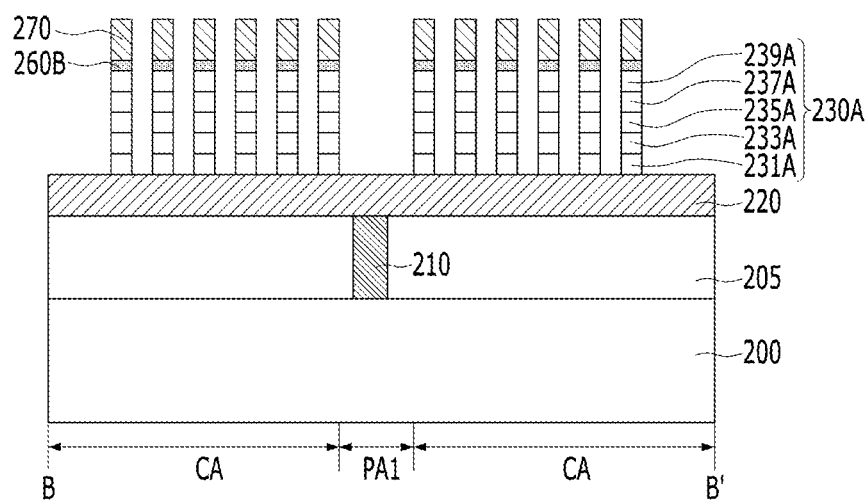

Referring to FIGS. 12A and 12B, second lines 270 may be formed by depositing a conductive layer on the resultant structure of FIGS. 11A and 11B and selectively etching the conductive layer. The second lines 270 may have a line shape extending in the second direction. Also, the second lines 270 may be formed to cross two cell regions CA arranged in the second direction and the second peripheral circuit region PA2 between the cell regions.

Subsequently, the material layer pattern 260A and the initial variable resistance elements 230 exposed by the second lines 270 may be etched to form the etched material layer patterns 260B and the variable resistance elements 230A.

The etched material layer patterns 260B may have a line shape overlapping the second lines 270, but may be separated from each other with the second peripheral circuit region PA2 between them in the second direction.

The variable resistance elements 230A may have an island shape on a plan view. Both sidewalls of the variable resistance element 230A may be aligned with both sidewalls of the second line 270 in the first direction. The variable resistance element 230A may include a lower electrode layer 231A, a selection element layer 233A, an intermediate electrode layer 235A, a variable resistance layer 237A, and an upper electrode layer 239A.

In the present implementation, the material layer that is used to form the variable resistance element 230A is first etched in the etching process for forming the first line 220, and is etched a second time in the etching process for forming the second line 270. Therefore, the sidewalls of the variable resistance element 230A may be aligned with the first line 220 and the second line 270. Unlike the implementation FIGS. 2A-7B, an additional mask for forming the variable resistance element 230A is not used, which further simplifies the process.

In the present implementation, since the material layer pattern 260A is etched after the second line 270 is etched, the material layer pattern 260A may have a line shape. Unlike the implementation of FIGS. 2A-7B, the material layer pattern 260A does not cover the cell region CA. Accordingly, in various embodiments, portions of the material layer pattern 260A disposed over cell regions CA may be substantially continuous over the cell regions or have a line pattern.

Embodiments of the present disclosure may simplify a production process while improving the reliability and performance characteristics of a semiconductor memory.

Memory circuits and other semiconductor devices based on the disclosed technology can be used in a range of devices or systems. FIGS. 13-16 provide some examples of devices or systems that can implement the memory circuits disclosed herein.

Figure 13:
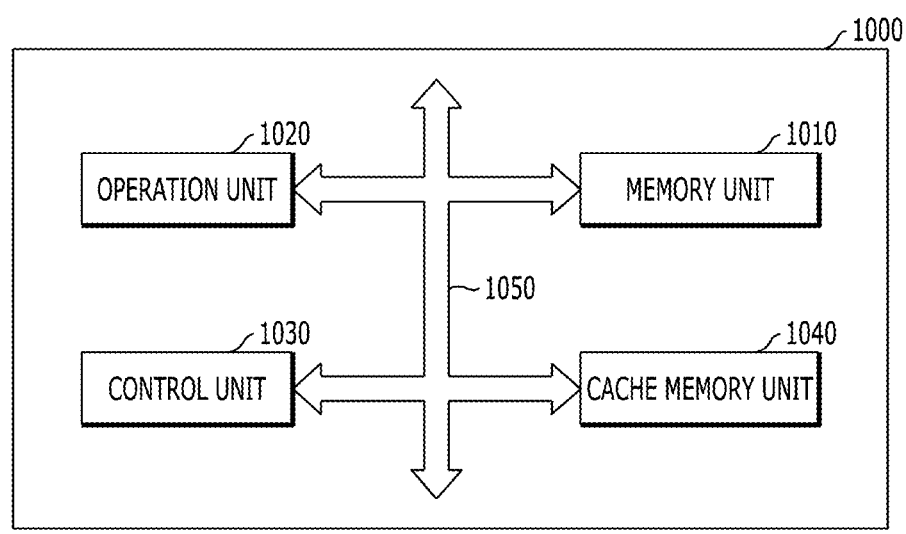
FIG. 13 is an example of configuration diagram of a microprocessor implementing memory circuitry based on the disclosed technology.

FIG. 13 is an example of configuration diagram of a microprocessor implementing memory circuitry based on the disclosed technology.

Referring to FIG. 13, a microprocessor 1000 may perform tasks for controlling and tuning a series of processes of receiving data from various external devices, processing the data, and outputting processing results to external devices. The microprocessor 1000 may include a memory unit 1010, an operation unit 1020, a control unit 1030, and so on. The microprocessor 1000 may be various data processing units such as a central processing unit (CPU), a graphic processing unit (GPU), a digital signal processor (DSP) and an application processor (AP).

The memory unit 1010 is a part which stores data in the microprocessor 1000, as a processor register, register or the like. The memory unit 1010 may include various registers such as a data register, an address register, a floating point register and so on. The memory unit 1010 may perform the function of temporarily storing data for which operations are to be performed by the operation unit 1020, result data of performing the operations and addresses where data for performing of the operations are stored.

The memory unit 1010 may include one or more of the above-described semiconductor devices in accordance with the implementations. For example, the memory unit 1010 may include a substrate including a first region in which a plurality of variable resistance elements are arranged, a second region disposed at one side of the first region in a first direction, and a third region disposed at one side of the first region in a second direction crossing the first direction; a plurality of first lines disposed over the substrate and extending in the first direction across the first region and the second region; a plurality of second lines disposed over the first lines and extending in the second direction across the first region and the third region; the variable resistance elements positioned at intersections of the first lines and the second lines between the first lines and the second lines; a contact plug disposed in the third region and having an upper end coupled to the second line; and a material layer interposed between the second line and the variable resistance element in the first region while being omitted between the second line and the contact plug in the third region, the material layer increasing a resistance of the variable resistance element. Through this, in the memory unit 1010, a reliability and fabricating processes may be improved. As a consequence, it is possible to improve operating characteristics of the microprocessor 1000.

The operation unit 1020 may perform four arithmetical operations or logical operations according to results that the control unit 1030 decodes commands. The operation unit 1020 may include at least one arithmetic logic unit (ALU) and so on.

The control unit 1030 may receive signals from the memory unit 1010, the operation unit 1020 and an external device of the microprocessor 1000, perform extraction, decoding of commands, and controlling input and output of signals of the microprocessor 1000, and execute processing represented by programs.

The microprocessor 1000 according to the present implementation may additionally include a cache memory unit 1040 which can temporarily store data to be inputted from an external device other than the memory unit 1010 or to be outputted to an external device. In this case, the cache memory unit 1040 may exchange data with the memory unit 1010, the operation unit 1020 and the control unit 1030 through a bus interface 1050.

Figure 14:
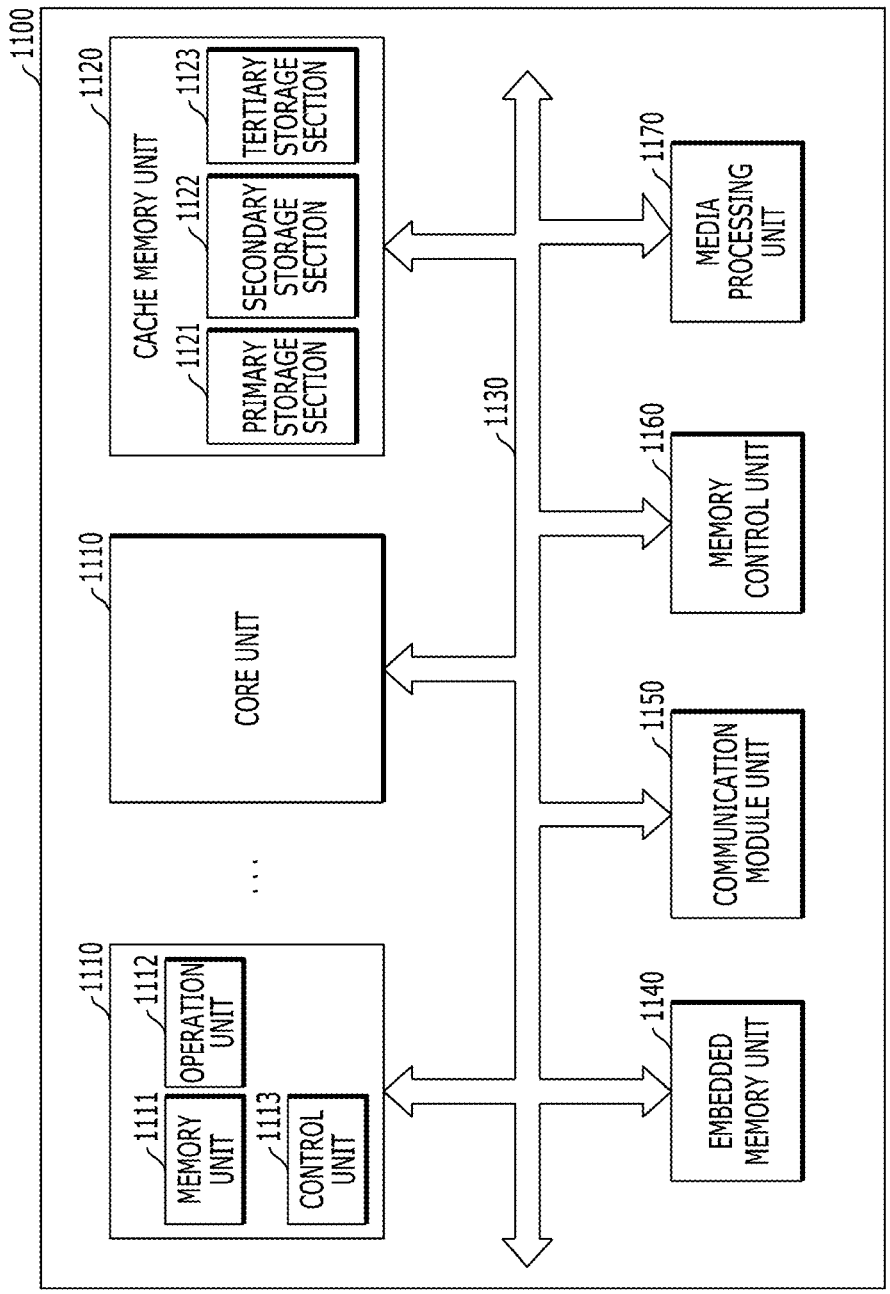
FIG. 14 is an example of configuration diagram of a processor implementing memory circuitry based on the disclosed technology.

FIG. 14 is an example of configuration diagram of a processor implementing memory circuitry based on the disclosed technology.

Referring to FIG. 14, a processor 1100 may improve performance and realize multi-functionality by including various functions other than those of the above-described microprocessor 1000. The processor 1100 may include a core unit 1110 which serves as the microprocessor, a cache memory unit 1120 which serves to storing data temporarily, and a bus interface 1130 for transferring data between internal and external devices. The processor 1100 may include various system-on-chips (SoCs) such as a multi-core processor, a graphic processing unit (GPU) and an application processor (AP).

The core unit 1110 of the present implementation is a part which performs arithmetic logic operations for data inputted from an external device, and may include a memory unit 1111, an operation unit 1112 and a control unit 1113. The memory unit 1111, the operation unit 1112 and the control unit 1113 may be substantially the same as the memory unit 1010, the operation unit 1020 and the control unit 1030.

The cache memory unit 1120 is a part which temporarily stores data to compensate for a difference in data processing speed between the core unit 1110 operating at a high speed and an external device operating at a low speed. The cache memory unit 1120 may include a primary storage section 1121 and a secondary storage section 1122. Further, the cache memory unit 1120 may include a tertiary storage section 1123 in the case where high storage capacity is required. As the occasion demands, the cache memory unit 1120 may include an increased number of storage sections. That is to say, the number of storage sections which are included in the cache memory unit 1120 may be changed according to a design. The speeds at which the primary, secondary and tertiary storage sections 1121, 1122 and 1123 store and discriminate data may be the same or different. In the case where the speeds of the respective storage sections 1121, 1122 and 1123 are different, the speed of the primary storage section 1121 may be largest. At least one storage section of the primary storage section 1121, the secondary storage section 1122 and the tertiary storage section 1123 of the cache memory unit 1120 may include one or more of the above-described semiconductor devices in accordance with the implementations. For example, the cache memory unit 1120 may include a substrate including a first region in which a plurality of variable resistance elements are arranged, a second region disposed at one side of the first region in a first direction, and a third region disposed at one side of the first region in a second direction crossing the first direction; a plurality of first lines disposed over the substrate and extending in the first direction across the first region and the second region; a plurality of second lines disposed over the first lines and extending in the second direction across the first region and the third region; the variable resistance elements positioned at intersections of the first lines and the second lines between the first lines and the second lines; a contact plug disposed in the third region and having an upper end coupled to the second line; and a material layer interposed between the second line and the variable resistance element in the first region while being omitted between the second line and the contact plug in the third region, the material layer increasing a resistance of the variable resistance element. Through this, a reliability and fabricating processes may be improved in the cache memory unit 1120. As a consequence, it is possible to improve operating characteristics of the processor 1100.

Although it was shown in this implementation that all the primary, secondary and tertiary storage sections 1121, 1122 and 1123 are configured inside the cache memory unit 1120, at least one of the primary, secondary and tertiary storage sections 1121, 1122 and 1123 of the cache memory unit 1120 may be configured outside the core unit 1110 and may compensate for a difference in data processing speed between the core unit 1110 and the external device.

The bus interface 1130 is a part which connects the core unit 1110, the cache memory unit 1120 and external device and allows data to be efficiently transmitted.

The processor 1100 according to the present implementation may include a plurality of core units 1110, and the plurality of core units 1110 may share the cache memory unit 1120. The plurality of core units 1110 and the cache memory unit 1120 may be directly connected or be connected through the bus interface 1130. The plurality of core units 1110 may be configured in the same way as the above-described configuration of the core unit 1110. Storage sections in each of the core units 1110 may be configured to be shared with storage sections outside the core units 1110 through the bus interface 1130.

The processor 1100 according to the present implementation may further include an embedded memory unit 1140 which stores data, a communication module unit 1150 which can transmit and receive data to and from an external device in a wired or wireless manner, a memory control unit 1160 which drives an external memory device, and a media processing unit 1170 which processes the data processed in the processor 1100 or the data inputted from an external input device and outputs the processed data to an external interface device and so on. Besides, the processor 1100 may include a plurality of various modules and devices. In this case, the plurality of modules which are added may exchange data with the core units 1110 and the cache memory unit 1120 and with one another, through the bus interface 1130.

The embedded memory unit 1140 may include not only a volatile memory but also a nonvolatile memory. The volatile memory may include a DRAM (dynamic random access memory), a mobile DRAM, an SRAM (static random access memory), and a memory with similar functions to above mentioned memories, and so on. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), a memory with similar functions.

The communication module unit 1150 may include a module capable of being connected with a wired network, a module capable of being connected with a wireless network and both of them. The wired network module may include a local area network (LAN), a universal serial bus (USB), an Ethernet, power line communication (PLC) such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB) such as various devices which send and receive data without transmit lines, and so on.

The memory control unit 1160 is to administrate and process data transmitted between the processor 1100 and an external storage device operating according to a different communication standard. The memory control unit 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The media processing unit 1170 may process the data processed in the processor 1100 or the data inputted in the forms of image, voice and others from the external input device and output the data to the external interface device. The media processing unit 1170 may include a graphic processing unit (GPU), a digital signal processor (DSP), a high definition audio device (HD audio), a high definition multimedia interface (HDMI) controller, and so on.

Figure 15:
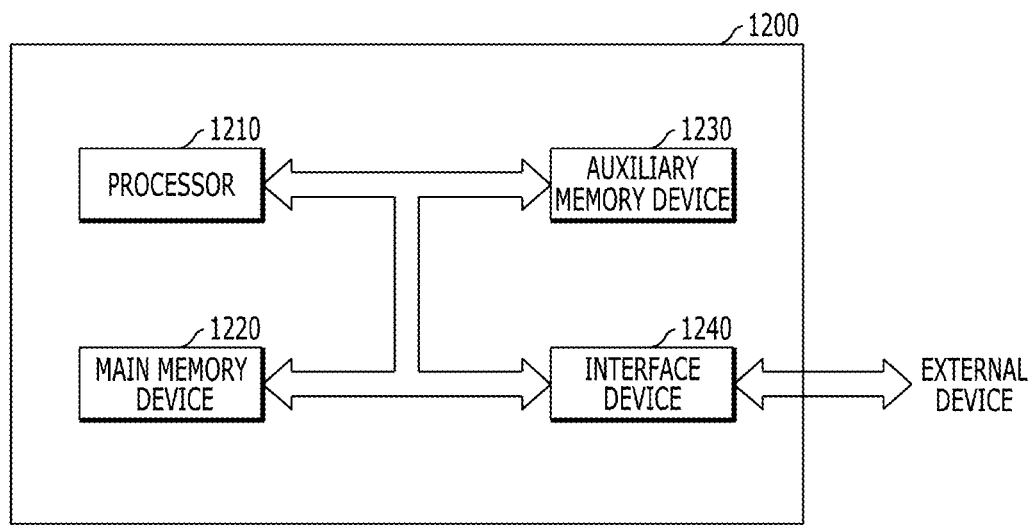
FIG. 15 is an example of configuration diagram of a system implementing memory circuitry based on the disclosed technology.

FIG. 15 is an example of configuration diagram of a system implementing memory circuitry based on the disclosed technology.

Referring to FIG. 15, a system 1200 as an apparatus for processing data may perform input, processing, output, communication, storage, etc. to conduct a series of manipulations for data. The system 1200 may include a processor 1210, a main memory device 1220, an auxiliary memory device 1230, an interface device 1240, and so on. The system 1200 of the present implementation may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 1210 may decode inputted commands and processes operation, comparison, etc. for the data stored in the system 1200, and controls these operations. The processor 1210 may substantially the same as the above-described microprocessor 1000 or the above-described processor 1100.

The main memory device 1220 is a storage which can temporarily store, call and execute program codes or data from the auxiliary memory device 1230 when programs are executed and can conserve memorized contents even when power supply is cut off. The auxiliary memory device 1230 is a memory device for storing program codes or data. While the speed of the auxiliary memory device 1230 is slower than the main memory device 1220, the auxiliary memory device 1230 can store a larger amount of data. The main memory device 1220 or the auxiliary memory device 1230 may include one or more of the above-described semiconductor devices in accordance with the implementations. For example, the main memory device 1220 or the auxiliary memory device 1230 may include a substrate including a first region in which a plurality of variable resistance elements are arranged, a second region disposed at one side of the first region in a first direction, and a third region disposed at one side of the first region in a second direction crossing the first direction; a plurality of first lines disposed over the substrate and extending in the first direction across the first region and the second region; a plurality of second lines disposed over the first lines and extending in the second direction across the first region and the third region; the variable resistance elements positioned at intersections of the first lines and the second lines between the first lines and the second lines; a contact plug disposed in the third region and having an upper end coupled to the second line; and a material layer interposed between the second line and the variable resistance element in the first region while being omitted between the second line and the contact plug in the third region, the material layer increasing a resistance of the variable resistance element. Through this, a reliability and fabricating processes may be improved in the main memory device 1220 or the auxiliary memory device 1230. As a consequence, it is possible to improve operating characteristics of the system 1200.

Also, the main memory device 1220 or the auxiliary memory device 1230 may include a memory system (see the reference numeral 1300 of FIG. 16) in addition to the above-described semiconductor device or without including the above-described semiconductor device.

The interface device 1240 may be to perform exchange of commands and data between the system 1200 of the present implementation and an external device. The interface device 1240 may be a keypad, a keyboard, a mouse, a speaker, a mike, a display, various human interface devices (HIDs), a communication device, and so on. The communication device may be substantially the same as the above-described communication module unit 1150.

Figure 16:
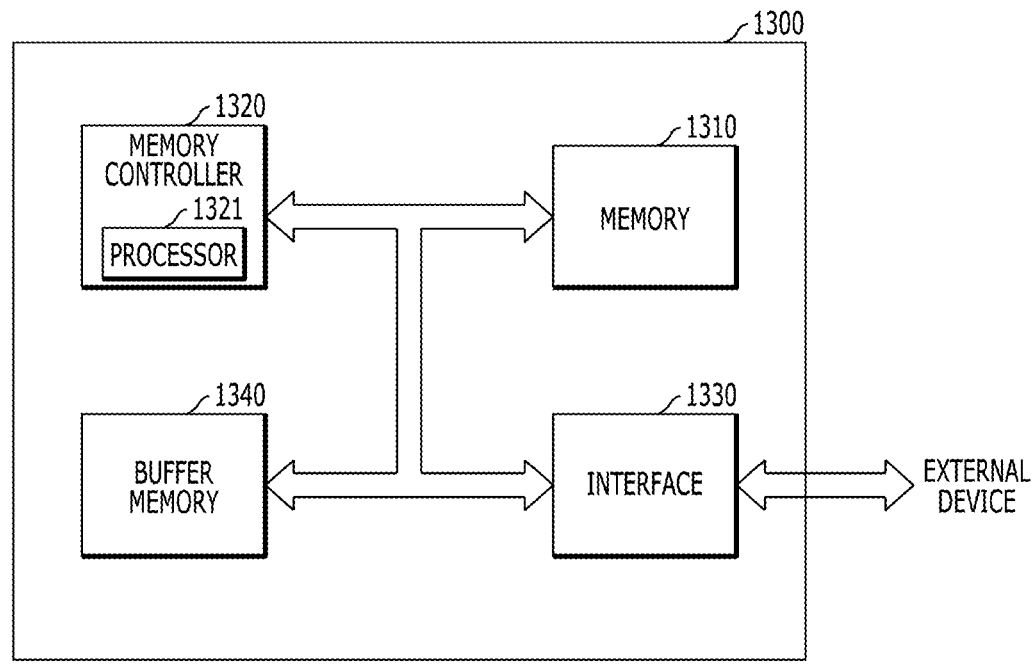
FIG. 16 is an example of configuration diagram of a memory system implementing memory circuitry based on the disclosed technology.

FIG. 16 is an example of configuration diagram of a memory system implementing memory circuitry based on the disclosed technology.

Referring to FIG. 16, a memory system 1300 may include a memory 1310 which has a nonvolatile characteristic as a component for storing data, a controller 1320 which controls the memory 1310, an interface 1330 for connection with an external device, and a buffer memory 1340 for storing data temporarily for efficiently transferring data between the interface 1330 and the memory 1310. The memory system 1300 may simply mean a memory for storing data, and may also mean a data storage device for conserving stored data in a long term. The memory system 1300 may be a disk type such as a solid state disk (SSD), and so on, and a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The memory 1310 or the buffer memory 1340 may include one or more of the above-described semiconductor devices in accordance with the implementations. For example, the memory 1310 or the buffer memory 1340 may include a substrate including a first region in which a plurality of variable resistance elements are arranged, a second region disposed at one side of the first region in a first direction, and a third region disposed at one side of the first region in a second direction crossing the first direction; a plurality of first lines disposed over the substrate and extending in the first direction across the first region and the second region; a plurality of second lines disposed over the first lines and extending in the second direction across the first region and the third region; the variable resistance elements positioned at intersections of the first lines and the second lines between the first lines and the second lines; a contact plug disposed in the third region and having an upper end coupled to the second line; and a material layer interposed between the second line and the variable resistance element in the first region while being omitted between the second line and the contact plug in the third region, the material layer increasing a resistance of the variable resistance element. Through this, in the memory 1310 or the buffer memory 1340, a reliability and fabricating processes may be improved. As a consequence, it is possible to improve operating characteristics of the memory system 1300.

The memory 1310 or the buffer memory 1340 may include various memories such as a nonvolatile memory or a volatile memory, in addition to the above-described semiconductor device or without including the above-described semiconductor device.

The controller 1320 may control exchange of data between the memory 1310 and the interface 1330. To this end, the controller 1320 may include a processor 1321 for performing an operation for, processing commands inputted through the interface 1330 from an outside of the memory system 1300 and so on.

The interface 1330 is to perform exchange of commands and data between the memory system 1300 and the external device. In the case where the memory system 1300 is a card type or a disk type, the interface 1330 may be compatible with interfaces which are used in devices having a card type or a disk type, or be compatible with interfaces which are used in devices similar to the above mentioned devices. The interface 1330 may be compatible with one or more interfaces having a different type from each other.

Features in the above examples of electronic devices or systems in FIGS. 13-16 based on the memory devices disclosed in this document may be implemented in various devices, systems or applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described. Other implementations, enhancements and variations can be made based on what is described and illustrated in this patent document.

What is claimed is:

1. A method for fabricating an electronic device comprising a semiconductor memory, the method comprising:
    providing a substrate including a first region, a second region disposed on one side of the first region in a first direction, and a third region disposed on another side of the first region in a second direction crossing the first direction;
    forming a plurality of first lines extending in the first direction across the first region and the second region, over the substrate;
    forming a plurality of variable resistance elements over the first lines in the first region;
    forming an interlayer insulating layer that fills spaces between the variable resistance elements;
    forming a contact plug passing through the interlayer insulating layer in the third region;
    forming a material layer that covers the variable resistance elements, the interlayer insulating layer and the contact plug, the material layer increasing a resistance of the variable resistance element;
    removing a portion of the material layer, which is disposed over the contact plug, to form a material layer pattern; and
    forming a plurality of second lines over the material layer pattern and the contact plug, the plurality of second lines extending in the second direction across the first region and the third region.

2. The method according to claim 1, wherein removing of the portion of the material layer is performed by a planarization process.

3. The method according to claim 2, wherein the planarization process is a CMP (Chemical Mechanical Polishing) process.

4. The method according to claim 2, wherein a pattern density of the first region is greater than a pattern density of the third region, and
    a removal rate of the material layer in the third region is greater than a removal rate of the material layer in the first region.

5. The method according to claim 2, wherein a portion of the interlayer insulating layer and a portion of the contact plug in the third region are removed when the portion of the material layer is removed.

6. The method according to claim 1, wherein the variable resistance element has a line shape overlapping the first line, and the method further comprises:
    etching portions of the material layer pattern and the variable resistance element exposed by the second lines, after forming the second lines.

7. The method according to claim 1, wherein the variable resistance elements are positioned at intersections of the first lines and the second lines, and each of the variable resistance elements has an island shape.

8. The method according to claim 1, further comprising:
    etching portions of the material layer pattern exposed by the second lines, after forming the second lines.

9. The method according to claim 1, wherein the material layer includes an insulating material, and
a current flow across the material layer increases as an applied voltage increases.

10. The method according to claim 1, wherein the material layer has a thickness of several to several tens of Å.

11. The method according to claim 1, wherein a portion of the material layer pattern covers the first region, and the portion of the material layer pattern that covers the first region has an even thickness.

12. The method according to claim 11, wherein the material layer pattern covers an edge portion of the third region, which is adjacent to the first region, and a middle portion of the third region is not covered by the material layer pattern.

13. The method according to claim 1, wherein the material layer pattern has a line shape overlapping the second line in the first region.

14. The method according to claim 1, wherein the material layer pattern extends to an edge portion of the third region, which is adjacent to the first region, and the material layer pattern is absent from a middle portion of the third region.

15. The method according to claim 1, further comprising:
forming a second contact plug disposed under the first line and coupled to the first line, before the forming of the first lines.

16. The method according to claim 1, wherein the second line and the second contact plug are in direct contact with each other.

17. The method according to claim 1, wherein the third region occupies a larger area than the second region.

18. The method according to claim 1, wherein a thickness of the material layer pattern in the first region is constant, and
a thickness of the material layer pattern in the third region varies.

19. The method according to claim 1, wherein a thickness of a thinnest part of the second line in the third region is greater than a thickness of a thinnest part of the second line in the first region.

20. The method according to claim 1, wherein the variable resistance element includes a variable resistance layer, and a selection element layer electrically coupled to the variable resistance layer.

* * * * *